United States Patent [19]

Harrison et al.

[11] Patent Number: 5,241,692
[45] Date of Patent: Aug. 31, 1993

[54] INTERFERENCE REDUCTION SYSTEM FOR A SPEECH RECOGNITION DEVICE

[75] Inventors: R. Mark Harrison, Grapevine; Kamyar Rohani, Fort Worth, both of Tex.

[73] Assignee: Motorola, Inc., Schaumburg, Ill.

[21] Appl. No.: 656,368

[22] Filed: Feb. 19, 1991

[51] Int. Cl.⁵ .............................. H04B 1/46; G10L 5/06
[52] U.S. Cl. ...................................... 455/79; 455/297; 455/345; 381/42; 381/46; 381/110
[58] Field of Search .................. 455/79, 99, 115–116, 455/296–297, 345; 381/42, 46, 94, 110

[56] References Cited

U.S. PATENT DOCUMENTS

| 4,625,083 | 11/1986 | Poikela | 381/71 |
| 4,737,976 | 4/1988 | Borth et al. | 381/46 |
| 4,769,847 | 9/1988 | Taguchi | 381/94 |
| 4,945,570 | 7/1990 | Gerson et al. | 381/110 |

FOREIGN PATENT DOCUMENTS

| 0244099 | 9/1990 | Japan | 381/46 |
| 8908910 | 9/1989 | PCT Int'l Appl. | 381/110 |
| 2239971 | 7/1991 | United Kingdom | 381/46 |

Primary Examiner—Reinhard J. Eisenzopf
Assistant Examiner—Andrew Faile
Attorney, Agent, or Firm—Robert S. Babayi; Michael J. Buchenhorner

[57] ABSTRACT

An apparatus for reducing audio interference produced by a transducer (18) in response to an audio signal has a first input for receiving the audio signal and a second input (22) for receiving sound signals. The audio interference affects a speech recognition system (34). The second input provides a possibly contaminated signal representing the sound signals. The sound signals comprise a desired audio signal, and possibly comprise the audio interference. An interference reduction device (30) is coupled to the first and second inputs, for transforming the possibly contaminated signal into features that are substantially free from the effects of the audio interference.

8 Claims, 2 Drawing Sheets

INTERFERENCE REDUCTION SYSTEM FOR A SPEECH RECOGNITION DEVICE

TECHNICAL FIELD

This invention relates generally to communications electronics, and more specifically to communications electronics using voice control.

BACKGROUND

Devices that require audio input, such as mobile radios, cellular telephones, and speech-recognition devices suffer from audio interference. In particular, speech recognition devices often require a clean audio signal (i.e., one that is substantially free from interference) to operate properly.

A straightforward way to cancel interference in a communication system is to estimate the interference in time, and subtract it from the signal received at the microphone. If a linear transfer function is used for the acoustic channel from the interference source to the microphone, the canceller could be implemented as follows:

$$s(k) = z(k) - y(k) = z(k) - \sum_{l=0}^{p} a_l x(k-l) - \sum_{m=1}^{q} b_l y(k-m) \quad (1)$$

Where:
- $s(k)$ is the estimated desired signal at time k.
- $z(k)$ is the sampled contaminated signal at time k.
- $y(k)$ is the interference estimated at time k;
- $x(k)$ is the sampled untransduced interference audio at the transducer;
- $a_i$ is the $i^{th}$ coefficient of the numerator of the acoustic channel transfer function estimate;
- p is the number of coefficients in the numerator of the transfer function estimate, or the number of zeroes;
- $b_i$ is the ith coefficient of the denominator of the acoustic channel transfer function estimate; and
- q is the number of coefficients $-1$, of the denominator of the transfer function estimate, or the number of poles.

The disadvantage of the above method is that it is computationally intensive. Thus, an interference reduction apparatus that is less computationally intensive would be desirable.

Speech recognition systems do not generally operate directly on the sampled speech. Instead they reduce the sampled speech to a parametric representation. The parameters of this representation are called its features. There are two common classes of recognition features: linear predictive coding (LPC) derived and filter bank derived. The extraction of these features and their use in speech recognition are described in L. R. Rabiner and S. E. Levinson, "Isolated and Connected Word Recognition-Theory and Selected Applications," IEEE Trans. on Comm., Vol. COM-29, No. 5, May 1981, at pp. 621-659. Both LPC and filter bank features are estimates of the power spectral density of the input signal. Since the interference is assumed to be added to the user's speech, the spectrum of the sum of the speech and interference is just the sum of the spectra of the individual signals. Therefore, knowledge of the interference of the speech as received at a microphone would allow it to be cancelled from the recognition features.

Typically, estimates of the power spectral density (PSD) of the interference are made based on a statistical model. One such approach is "spectral subtraction" described in Jae S. Lim, A. V. Oppenheim, "Enhancement and Bandwidth, Compression of Noisy Speech," Proc. of the IEEE, Vol. 67, No. 12, December 1979, pp. 1586-1604, and in M. S. Ahmed, "Comparisons of Noisy Speech Enhancement Algorithms in Terms of LPC Perturbation," IEEE Trans. on ASSP, Vol. 37, No. 1, January 1989 at pp. 121-125. This method calculates the PSD for the contaminated signal and cancels the estimated PSD from the contaminated signal PSD using the following equation:

$$\hat{S}(f) = [|Z(f)|^a - |Y(f)|^a]^{1/a} \quad (2)$$

Where:
- $S(f)$ is the estimated PSD of the desired speech;
- $Z(f)$ is the estimated PSD of the contaminated audio; and
- $Y(f)$ is the estimated PSD of the interfering audio.

The subtraction of the interferer's PSD from the contaminated PSD implies that the interferer and the desired signal are uncorrelated. If this were not true, the PSD of their sum would not be the sum of the PSD of the individual signals.

The accuracy of this method suffers from two problems. First, the interferer and desired signals' correlation will not be zero for finite samples, which violates the uncorrelated assumption. Second, only estimates of the power spectrum are available, so that negative PSDs will sometimes result.

SUMMARY OF THE INVENTION

Briefly, according to the invention, an apparatus for reducing audio interference produced by a transducer in response to an audio signal, the audio interference affecting a speech recognition system, comprises a first input for receiving the audio signal, and a second input for receiving sound signals. The second input also provides a possibly contaminated signal representing the sound signals, the sound signals comprising a desired audio signal, and possibly comprising the audio interference. Interference reduction means is coupled to the first and second inputs, for transforming the possibly contaminated signal into features that are substantially free from the effects of the audio interference.

DETAILED DESCRIPTION OF THE PREFERRED EMBODIMENT

Figure 1:
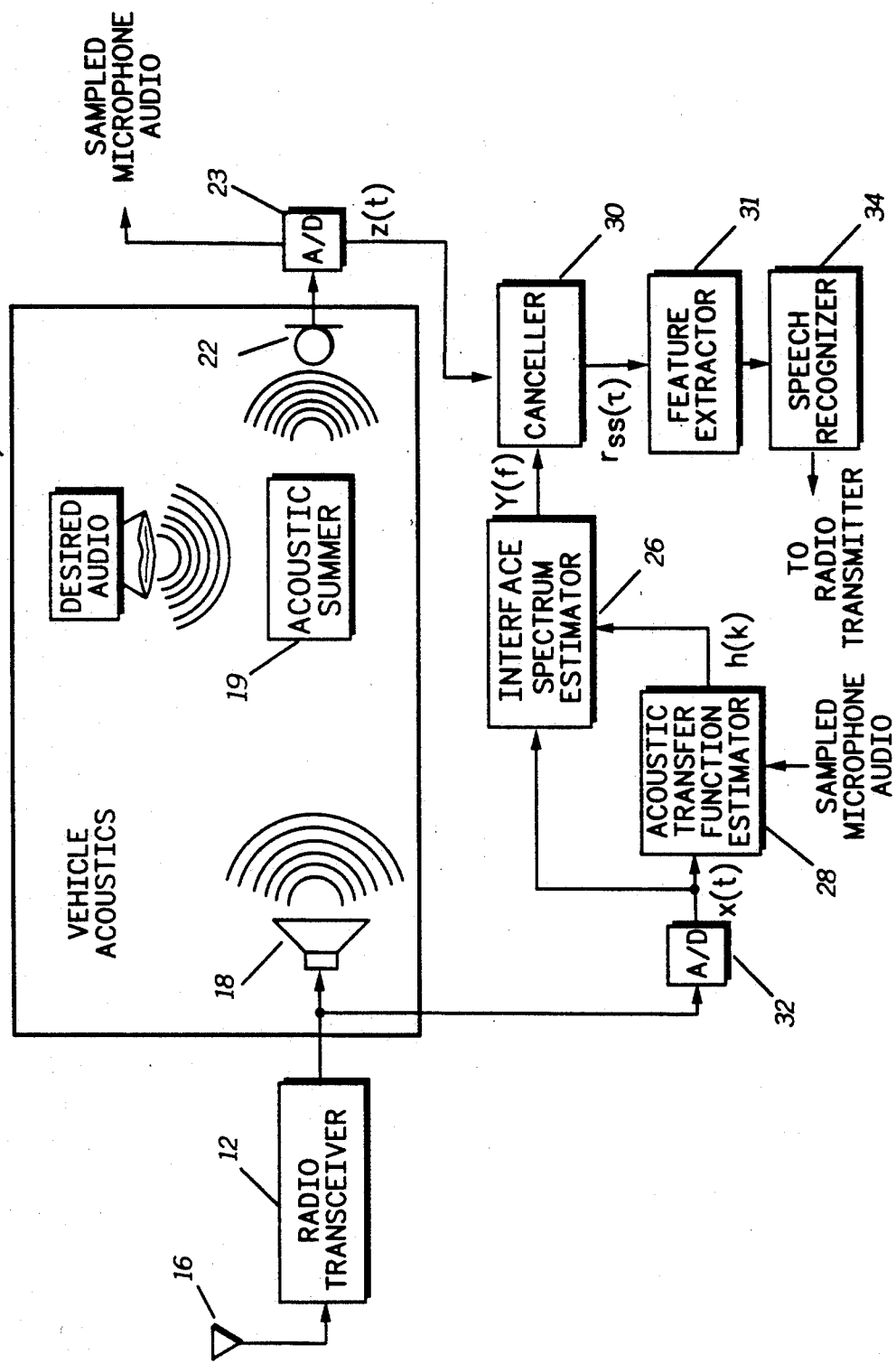
FIG. 1 shows a two-way radio system with an interference elimination apparatus in accordance with the invention.

Referring to FIG. 1, there is shown a voice recognition controlled two-way radio system 10 with an audio interference reduction (or elimination) apparatus in accordance with the invention. When the radio transceiver 12 is receiving signals (via the antenna 16), the radio transceiver 12 produces an audio output signal that is applied to a speaker 18. The speaker transduces the audio output signal to produce a speaker sound signal representing the audio output signal. The speaker sound signal is transformed by the vehicle acoustics 20 of the environment of the radio system 10 (e.g., an automobile cabin that is at least partially enclosed) into a transformed audio signal (i.e., the interfering audio). This transformed signal interferes with voice commands (produced by a person, not shown) to the speech recognizer 34. The summer 19 represents the receipt of both the desired audio and the interference audio originating from the speaker 18. Then interference contaminated desired audio is received by microphone 22, wherein it is transduced into an electric audio signal. An analog-to-digital (A/D) converter 23 receives the output of the microphone 22. The output of the A/D converter 23 is then applied to a Fourier transformer 207 (shown in FIG. 2) which is within the canceller 30, and whose output is the discrete Fourier transform (DFT) produced by a fast Fourier transform (FFT) of the interference contaminated audio. The DFT may be calculated using any general purpose DSP, such as the DSP56001 manufactured by Motorola. A second A/D converter 32 has an input coupled to the output of the transceiver 12 for receiving the audio output signal. The output converter 32 is used to digitize the audio output signal. The output of the second A/D converter 32 (a digitized transceiver output signal) is provided to an interference spectrum estimator 26, and to an acoustic model (or transfer function) estimator 28. The acoustic model estimator 28 uses the sampled transformed speaker audio, produced by the A/D 23 and the untransformed speaker output audio sampled by A/D 32 to determine the transformation imposed upon the speaker audio by the vehicle acoustics 20. This transformation, or acoustic model, is used in the interference spectrum estimator 26 with the sampled speaker audio from A/D 32 to determine an estimate of the spectrum of the transformed speaker audio as it would be received at the microphone 22. The estimated interference spectrum is then removed from the contaminated desired audio spectrum output from the FFT 207 in the interference canceller 30. The canceller 30 calculates the autocorrelation of the cancelled audio from the cancelled spectrum. The uncontaminated autocorrelations are then passed to the features extractor 31 which extracts features and provides them to the speech recognizer 34, which uses them to determine the voice command spoken by the user.

The present invention determines the acoustic channel (20) response from measurements of the interference at the input to the channel. Therefore, the spectrum of the output of the channel (which is the input to the microphone 22) can be determined using the estimated channel response, and characteristics of the measured untransduced audio. The estimated interference spectrum may be cancelled simply by subtracting it from the contaminated spectrum.

According to the invention, a parametric representation of the desired audio is directly applied to a speech recognizer. Thus, sampled audio need not be produced at the output. Instead, a parametric representation of the audio may be provided at the output. Therefore, the invention produces a parametric representation of the audio that is free of interference, and is less computationally intensive than substracting the interferer from the contaminated audio by sample.

The acoustic transfer function estimator 28 models the acoustics as a linear transfer function which transforms the sampled untransduced speaker audio produced by A/D 32 into the audio received at the microphone 22 and digitized by A/D 23. This linear transfer function may be expressed as:

$$y(k) = \sum_{l=0}^{p} a_l x(k-l) - \sum_{m=1}^{q} b_m y(k-m) \quad (3)$$

Where:
  y(k) is the transformed audio (interference) at time k;
  x(k) is the sampled audio at the transducer;
  $a_i$ is the $i^{th}$ coefficient of the numerator of the acoustic channel transfer function estimate; and
  $b_i$ is the ith coefficient of the denominator of the acoustic channel transfer function estimate.

A least squares pole-zero estimate of the acoustic transfer function may be derived as follows. Let a vector of untransduced speaker audio samples (from A/D 32) starting at time (i) with length L+1 be denoted by:

$$x'_i = [x(i-1) \ldots x(i-L)] \quad (4)$$

Similarly, the vector of microphone samples (from A/D 23) starting at time i with length M+1 is denoted:

$$y'_i = [y(i-1)y(i-2) \ldots y(i-M-1)] \quad (5)$$

Where "t" means "transpose."

The vector c, which predicts the microphone sample y(i) with the minimum means square error, must be determined. The predictor uses past samples of the microphone, as well as samples from the speaker audio, which allows us to create a pole-zero model. If the composite vector x is formed, as follows:

$$x'_i = [x'_i y'_i] \quad (6)$$

then the estimate of microphone sample y(i) may be found:

$$y(i) = x'_i c \quad (7)$$

Similarly, a composite data matrix may be defined, so that more than one estimate can be made:

$$X = \begin{bmatrix} x(0) & \ldots & x(-L) & y(-1) & \ldots & y(-M-1) \\ x(1) & \ldots & x(-L+1) & y(0) & \ldots & y(-M) \\ \vdots & & \vdots & \vdots & & \vdots \\ x(N) & \ldots & x(N-L) & y(N) & \ldots & y(N-M-1) \end{bmatrix} \quad (8)$$

The least squares estimate then satisfies:

$$y = Xc \quad (9)$$

Where y is a vector of microphone samples:

$$y'_i = [y(i)y(i) \ldots y(i-M)] \quad (10)$$

The least squares estimate of c may be found by premultiplying both sides of the above equation by $X^t$ which results in:

$$X^t X c = X^t y \quad (11)$$

Note that matrix $X^t X$ has the structure:

$$X^t X = \begin{bmatrix} R_{xx} & R_{xy} \\ R'_{xy} & R_{yy} \end{bmatrix} \quad (12)$$

Where:

$R_{xx}$ is the non windowed autocorrelation matrix (sometimes called the covariance matrix) of x;

$R_{xy}$ is the non windowed cross correlation matrix between x and y; and $R_{yy}$ is the non windowed autocorrelation matrix of y.

The vector $X^t y$ has the structure:

$$X^t y = \begin{bmatrix} r_{xy} \\ r_{yy} \end{bmatrix} \quad (13)$$

Where:

$r_{xy}$ is the non windowed cross correlation vector between x and y, and $r_{yy}$ is the autocorrelation vector of y.

The block structures of the above matrix and vector are quite similar to those found in the standard linear prediction case. This allows standard linear prediction methods to be used to solve the equation.

The simplest method of solving this type of matrix equation is to apply Gaussian elimination. While this method is not fast, it does not require the matrix to have any particular structure, and is straightforward to implement. A robust Gaussian elimination algorithm is presented in G. H. Golub, C. F. Van Loan, *Matrix Computations*, (chapt. 3)., Johns Hopkins University Press, Baltimore, Md. 1989.

Gaussian elimination is too computationally intensive, and uses too much memory to be desirable in a real time system. Unfortunately, fast algorithms solving this pole-zero problem are not available. However, if the estimate is restricted to be all-zero, the matrix X is reduced to contain only the submatrix $R_{xx}$. Therefore, equation (13) reduces to:

$$R_{xx} v = r_{xy} \quad (14)$$

The preferred embodiment of the acoustic transfer function estimator 28 utilizes the modified Levinson-Durbin algorithms as described in S. L. Marple, *Digital Spectral Analysis with Applications*, (chapt. 3) Prentice Hall, Englewood Cliffs, N.J. 1987.

The speech recognizer 30 may operate using LPC features. These features are determined from the autocorrelation of the sampled microphone audio. It is the purpose of the interference canceller 30 to produce interference free autocorrelations for the speech recognizer 34.

Figure 2:
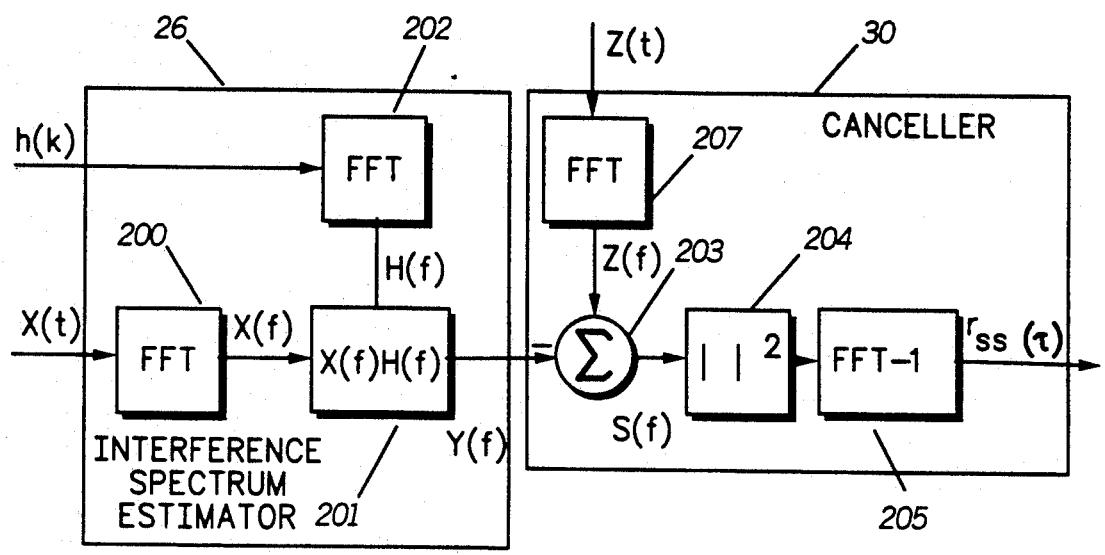
FIG. 2 shows a block diagram of an interference estimator and an interference canceller in accordance with the invention.

The interference estimator 26 and the interference canceller 30 are diagrammed in FIG. 2. Block 200 takes the discrete Fourier transform of the sampled interferer x(t) audio (the output of A/D 32). This transform is accomplished using a well known fast Fourier transform (FFT). Similarly, block 202 finds the DFT of the impulse response of the acoustic channel, h(k) which is just the coefficients of the finite impulse response (FIR) acoustic channel model, $a_k$. The transformed interference, X(f), is multiplied at each frequency of interest by the discrete Fourier transform of the estimate of the acoustic channel response, H(f), at each frequency bin produced by the transform in block 201. This operation produces the Fourier transform of the estimated interference as it would be received at the microphone 22 and is denoted as Y(f). The contaminated audio spectrum A(f) (i.e., the audio interference plus the desired audio) is cleaned up by subtracting Y(f) as diagrammed by the summer 203. The autocorrelation is finally determined by taking the magnitude (squared) of each frequency bin (block 204) and then finding the inverse Fourier transform of the clean spectrum S(f), producing the autocorrelation estimate of the clean audio $r_{ss}(\tau)$.

A typical speech recognition system estimates the features for blocks of samples of 20 ms duration, called a "frame." For a (common) sample rate of 8 kHz, this corresponds to 160 samples per frame. Therefore, the FFTs described above would be 256 samples long with the last 96 samples set to zero, or "zero padded." The output of the inverse FFT block 205 is 256 autocorrelations. Since the feature extractors in speech recognition systems typically use only eight-to-twelve of these autocorrelations, only the number required will be sent to the recognizer. The preferred embodiment of this invention will send only eight autocorrelations to the recognizer. At each 20 ms interval, the canceller 30 reads the (precalculated) transform of the acoustic channel response, H(f), and receives a frame of samples from the A/Ds 23 and 32, corresponding to the untransduced interference x(t) and the contaminated audio spectrum A(f). By the end of this same 20 ms interval, the canceller provides the estimate of the autocorrelation of the desired audio $r_{ss}(\tau)$.

Referring again to FIG. 1, the feature extractor 31 uses the autocorrelation sequence estimate rss($\tau$), to calculate the recognition features. The features extracted will be those features required by the recognizer 34. In the preferred embodiment, it will be assumed that the recognizer 34 requires Line Spectral Frequencies, which are described in Kabal and Ramachandran, "The Computation of Line Spectral Frequencies Using Chebyshev Polynomials", IEEE Tansactions on Acoustics, Speech, and Signal Processing, Vol. ASSP-34, No. 6, December 1986, as is the method of their calculation.

Figure 3:
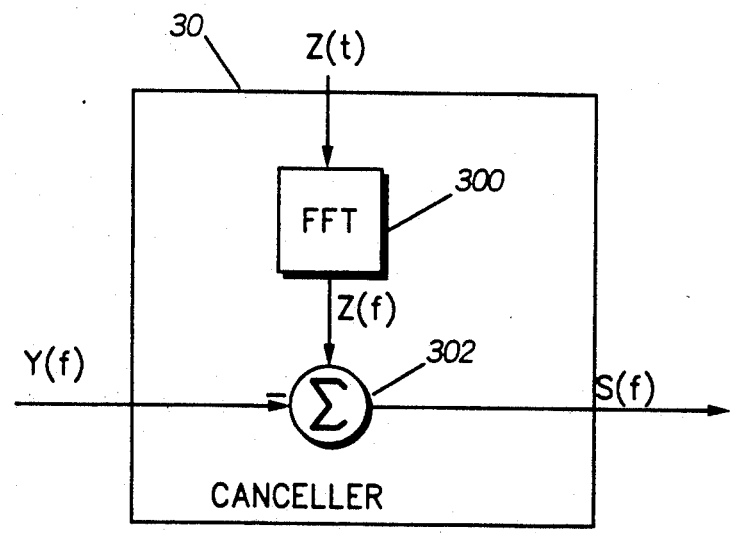
FIG. 3 shows an alternate canceller in accordance with the invention.

The invention contemplates use of whatever features are required in the recognition system, and is not limited to the LSF features used in the preferred embodiment. If the features calculated are not based on autocorrelation, but are based on the DFT of the desired audio, the canceller 30 will have a simpler structure, as diagrammed in FIG. 3. In the case of FIG. 3, the canceller 30 simply subtracts the estimated interferer spectrum, Y(f), from the contaminated spectrum, Z(f), to produce the estimated clean spectrum of the desired audio, S(f). In this variation, the canceller 30 passes S(f) to the feature extractor 31, which calculates the DFT based features.

Thus, the invention solves the problems of the prior art by utilizing the direct measurements of the interferer, and estimates of the acoustic transfer function. This allows the spectrum of the interferer, not its magnitude spectrum, to be subtracted from the contaminated audio. Since the spectrum is subtracted, illegal spectra cannot occur as they do when magnitude spectra are subtracted. Furthermore, a measurement of the interferer spectrum is now available, which eliminates the need for an interferer model. This results in more accurate cancellation of the interferer from the contaminated audio.

What is claimed is:

1. In a speech recognition system, an apparatus for reducing audio interference to facilitate recognition of a desired voice signal, the audio interference being produced by a transducer in response to an audio signal, comprising:

means for receiving the audio signal;

means for receiving sound signals, the sound signals comprising the desired voice signal, and comprising the audio interference;

interference estimation means responsive to the audio signal for producing a transformed estimate of the audio interference; and interference reduction means for transforming the sound signals in accordance with the transformed estimate of the audio interference into features that are substantially free from the effects of the audio interference, said interference reduction means including:

means for performing a Fourier transform of the sound signals to provide transformed sound signals;

a canceller, coupled to receive the transformed sound signals, for producing a parametric representation of the desired voice signal; and a feature extractor for receiving the parametric representation of the desired voice signal and for producing speech recognition features in response to the parametric representation of the desired voice signal.

2. The apparatus for reducing audio interference of claim 1, wherein the parametric representation of the desired voice signal comprises a spectral estimate of the desired voice signal.

3. The apparatus for reducing audio interference of claim 1, wherein the parametric representation of the desired voice signal comprises an autocorrelation of the desired voice signal.

4. An apparatus for reducing audio interference produced by a transducer in response to an audio signal, the audio interference affecting a speech recognition system, comprising:

means for receiving the audio signal;

a speaker for transducing the audio signal to produce audio interference;

means for receiving sound signals, the sound signals comprising a desired voice signal, and comprising the audio interference;

acoustic modeling means responsive to the audio signal and to the sound signals for providing an acoustic model of the environment of the speech recognition system;

interference estimation means responsive to the audio signal for producing a transformed estimate of the audio interference with the acoustic model of the environment of the speech recognition system; and interference reduction means responsive to the sound signals and to the acoustic model of the environment of the speech recognition system, for transforming, in accordance with the transformed estimate of the audio interference, the sound signals into features that are substantially free from the effects of the audio interference.

5. The apparatus for reducing audio interference of claim 4, wherein the interference reduction means comprises:

means for performing a Fourier transform of the sound signals to provide transformed sound signals;

a canceller coupled to receive the transformed sound signals for producing a parametric representation of the desired voice signal; and a features extractor for receiving the parametric representation of the desired voice signal and for producing speech recognition features in response to the parametric representation of the desired voice signal.

6. The apparatus for reducing audio interference of claim 4, wherein the parametric representation of the desired voice signal comprises a spectral estimate of the desired voice signal.

7. The apparatus for reducing audio interference of claim 4, wherein the parametric representation of the desired voice signal comprises an autocorrelation of the desired voice signal.

8. A voice controlled radio comprising:

a radio transceiver having an output for providing transceiver output audio signals;

a speaker, coupled to the output of the radio transceiver, for converting the transceiver output audio signals into speaker sound signals, the speaker sound signals contributing to audio interference;

a microphone, coupled to the radio, for receiving sound signals, the sound signals comprising a desired voice signal, and the speaker sound signals which contribute to the audio interference;

acoustic modeling means, coupled to receive the transceiver output audio signals, for sampling the transceiver output audio signals, and coupled to the microphone for providing an acoustic model of the environment of the radio;

interference estimation means, coupled to receive the transceiver output audio signals for producing a transformed estimate of the audio interference with the acoustic model of the environment of the radio; and interference reduction means, coupled to the microphone and to the acoustic modeling means, for transforming, in accordance with the transformed estimate of the audio interference, the desired voice signal into features that are substantially free from the effects of the audio interference.

* * * * *